(12) United States Patent
Ueno et al.

(10) Patent No.: US 12,302,716 B2
(45) Date of Patent: May 13, 2025

(54) LUMINANCE SENSOR FOR BENT DISPLAY

(71) Applicant: SHARP KABUSHIKI KAISHA, Sakai (JP)

(72) Inventors: Masafumi Ueno, Sakai (JP); Masaaki Moriya, Sakai (JP); Naoki Shiobara, Sakai (JP); Masafumi Kawai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 490 days.

(21) Appl. No.: 17/796,441

(22) PCT Filed: Feb. 20, 2020

(86) PCT No.: PCT/JP2020/006799
§ 371 (c)(1),
(2) Date: Jul. 29, 2022

(87) PCT Pub. No.: WO2021/166162
PCT Pub. Date: Aug. 26, 2021

(65) Prior Publication Data
US 2023/0050781 A1    Feb. 16, 2023

(51) Int. Cl.
*H10K 59/13*   (2023.01)
*B32B 3/26*    (2006.01)
*B32B 27/08*   (2006.01)
*B32B 27/36*   (2006.01)
*H10K 59/131*  (2023.01)
*H10K 77/10*   (2023.01)
*H10K 102/00*  (2023.01)

(52) U.S. Cl.
CPC ............. *H10K 59/13* (2023.02); *B32B 3/266* (2013.01); *H10K 59/131* (2023.02); *H10K 77/111* (2023.02); *B32B 27/08* (2013.01); *B32B 27/36* (2013.01); *B32B 2255/26* (2013.01); *B32B 2307/422* (2013.01); *B32B 2307/546* (2013.01); *B32B 2457/20* (2013.01); *H10K 2102/311* (2023.02)

(58) Field of Classification Search
CPC .... H10K 59/13; H10K 59/131; H10K 77/111; H10K 2102/311; H10K 59/60; B32B 3/266; B32B 27/08; B32B 27/36; B32B 2255/26; B32B 2307/422; B32B 2307/546; B32B 2457/20; G06F 1/1626; G06F 1/1637; Y02E 10/549; G09F 9/00; G09F 9/30
See application file for complete search history.

(56) References Cited

U.S. PATENT DOCUMENTS

2018/0366523 A1* 12/2018 Yoshida ............. H10K 59/8791
2019/0259351 A1*  8/2019 Yoon ...................... G09G 3/035

FOREIGN PATENT DOCUMENTS

JP    2011209482 A    10/2011

* cited by examiner

*Primary Examiner* — J.E. Schoenholtz
(74) *Attorney, Agent, or Firm* — ScienBiziP, P.C.

(57) ABSTRACT

A display device includes a substrate with a display area and a bending area; and a luminance sensor. The display area and the bending area each include a pixel circuit including a light-emitting element that is self-luminous. The bending area is bent from the display area. The luminance sensor measures luminance of the light-emitting element in the bending area.

13 Claims, 8 Drawing Sheets

LUMINANCE SENSOR FOR BENT DISPLAY

TECHNICAL FIELD

The disclosure relates to display devices.

BACKGROUND ART

Patent Literature 1 discloses a signal processing device for correcting image sticking with high precision on a display device including light-emitting elements. This signal processing device employs a panel structure in which dummy pixels, light-emitting elements, and a luminance sensor are all provided in the same plane in an area other than a display area to predict the current luminous efficiency of the light-emitting elements. In addition, the signal processing device is configured to correct grayscale signals fed to pixels on the basis of the results of monitoring the electrical properties of drive TFT (thin film transistor) and MED (organic light-emitting diode) elements and the results of measuring the light-emission luminance of the OLED elements.

CITATION LIST

Patent Literature

Patent Literature 1: Japanese Unexamined Patent Application Publication, Tokukai, No. 2011-209482

SUMMARY

Technical Problem

However, in the known signal processing device above, there is a problem that the number of wiring lines needs to be increased because the panel structure is such that dummy pixels, light-emitting elements, and a luminance sensor are all provided in an area other than the display area. Additionally, the signal processing device has problems that there is a need to individually control the dummy pixels apart from the driving and controlling of the display area and to acquire luminance information. In addition, the signal processing device has another problem that a high-precision luminance sensor cannot be provided because a luminance sensor is provided in the same plane. Also, in a signal processing device with a narrow frame panel, there is a problem of space for providing a luminance sensor, and the effect of external light also needs to be taken into account.

The disclosure, in an aspect thereof, has been made in view of these problems and has an object to realize a display device that allows the provision of a high-precision luminance sensor, reduces the effect of external light, and measures the luminance of the display area with high precision.

Solution to Problem

A display device of one aspect of the disclosure includes: a substrate with a display area and a bending area; and a luminance sensor, wherein the display area and the bending area each include a pixel circuit including a light-emitting element that is self-luminous, the bending area is bent from the display area, and the luminance sensor measures luminance of the light-emitting element in the bending area.

Effects of Disclosure

The disclosure, in an aspect thereof, has advantages of allowing the provision of a high-precision luminance sensor, reducing the effect of external light, and measuring the luminance of the display area with high precision.

DESCRIPTION OF EMBODIMENTS

Embodiment 1

Figure 1:
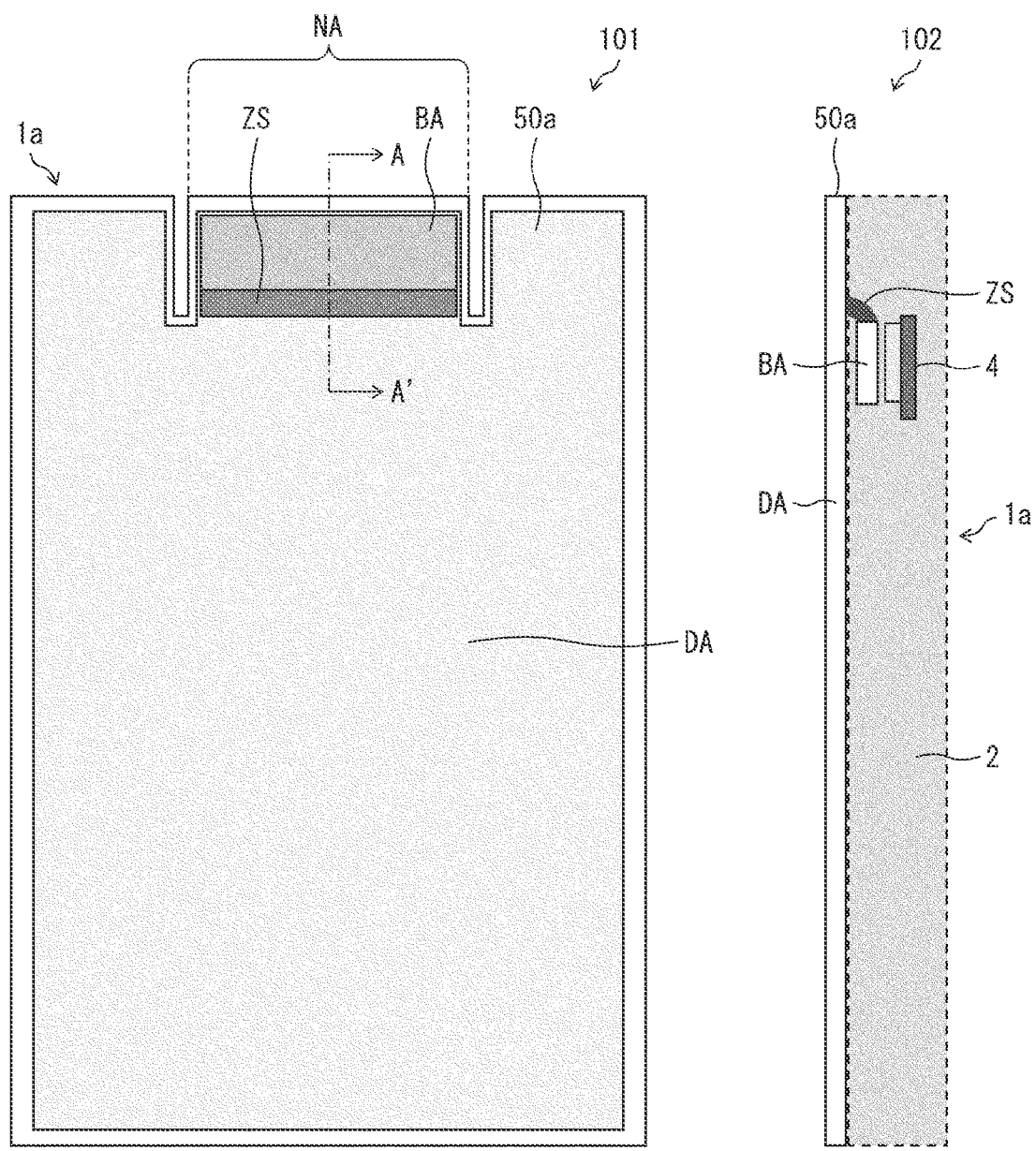
In FIG. 1, the drawing indicated by numeral 101 is a front view of a display device in accordance with Embodiment 1 of the disclosure, and the drawing indicated by numeral 102 is a cross-sectional view of the display device as viewed from the right-hand side face when the display device is viewed from the front.

An overview is given first of a structure of a display device 1a in accordance with Embodiment 1 of the disclosure with reference to FIG. 1. As shown in the drawing indicated by numeral 101 in FIG. 1, the display device 1a includes a substrate 50a with a display area DA and a bending area BA. The substrate 50a is either entirely flexible or partially flexible in a portion corresponding to a bending line for the bending area BA. In addition, each of the display area DA and the bending area BA has a pixel circuit including self-luminous light-emitting elements (see pixel circuits 61 and 62 in FIG. 2).

Next, as shown in the drawing indicated by numeral 102 in FIG. 1, in the display device 1a, the bending area BA is bent from the display area DA by approximately 180°. Specifically, the bending area BA is bendable toward the backside of the display panel (display screen) of the display device 1a and module-mounted while being folded up on the backside of the display panel.

For instance, recent smartphones have a "notched area Na" for mounting a camera and a sensor. In the present embodiment, in this notched area NA, an area that has the same pixel structure (drive circuit and light-emitting elements) as the display area DA of the display, panel of the display device 1a is provided as the bendable bending area BA. Additionally, the bending area BA is configured such that the light-emitting elements can be turned on with the bending area BA being bent toward the rear face of the display panel. Furthermore, the bending area BA is also configured such that the drive voltage and current of each pixel can be monitored.

In addition, as shown in the drawing indicated by numeral 102 in FIG. 1, inside a housing 2 of the display device 1a, there is provided a luminance sensor 4 for detecting the luminance of the bending area BA, The bending area BA resides on the rear face of the display panel, facing the luminance sensor 4, when bent from the display area DA. This positioning of the luminance sensor 4 inside the housing 2 on the rear face of the display panel enables the measurement of the light-emission luminance of the bending area BA.

This structure allows the luminance sensor 4 to be disposed in a space formed inside the housing 2 on the rear side of the display panel of the display device 1a. Therefore, the high-precision luminance sensor 4 can be disposed in the space, so that the effect of external light on the results of detection by the luminance sensor 4 can be reduced.

Additionally, in the bending area BA, there are provided a pixel circuit and light-emitting elements equivalent to the display area. DA of a typical display panel, so that the light-emitting elements emit light in response to common display signals. In addition, the output luminance of the bending area BA bent toward the rear side of the display panel can be measured by the luminance sensor 4 separately disposed inside the housing 2. Based on the results of measuring this luminance, decreases in the luminous efficiency of the display area. DA are accurately known, and the current fed to each pixel is controlled in such a manner as to compensate for the decreases. Therefore, according to the aforementioned structure, by detecting the luminance of the bending area BA by the luminance sensor 4, the luminance of the display area DA can be measured with high precision.

In the present embodiment, to accurately compensate for decays of the luminous efficiency, the bending area BA (or display luminance observation area) is provided in a part of the display area. DA of the display device 1a. The bending area BA is structured, for example, as a part of the flexible display panel.

Although the display drive control for the bending area BA in accordance with the present embodiment can be configured to separately perform control (signal inputs via other wiring), such a complicated configuration is not employed in the present embodiment. For instance, the bending area BA can input display signals as a part of the display area DA (rectangular video signal) and when voltage and current are monitored, can similarly monitor as a part of the display area DA. In other words, in reception of input video signals, monitoring control, and data acquisition, similarly to a known rectangular panel with no bending portion, as a rectangular area including the bending area BA, by enabling signal transmission and reception, data signals can be easily handled.

In addition, in the present embodiment, there is a "bending portion ZS" between the "bending area BA" and the "display area DA." This "bending portion ZS" is configured to be formed by a flexible connection wiring region. The bending area BA is bent along a part of the periphery of the display area. DA as a bending line. In other words, the notched area NA is formed in the display area DA, and the bending line is a part of the periphery of the notched area NA. Note that although the bending portion ZS does not have a pixel structure, wiring lines are provided that can be controlled through display signals for a rectangular area including the "bending area BA."

Additionally, in the present embodiment, by producing the entire display panel as a flexible panel, the bending area BA is rendered bendable (the bending area BA can also be turned on) without having to separately forming a flexible wiring region. Hence, it is also possible to simplify the manufacture of the display panel.

Details of Structure Around Bending Portion

Figure 2:
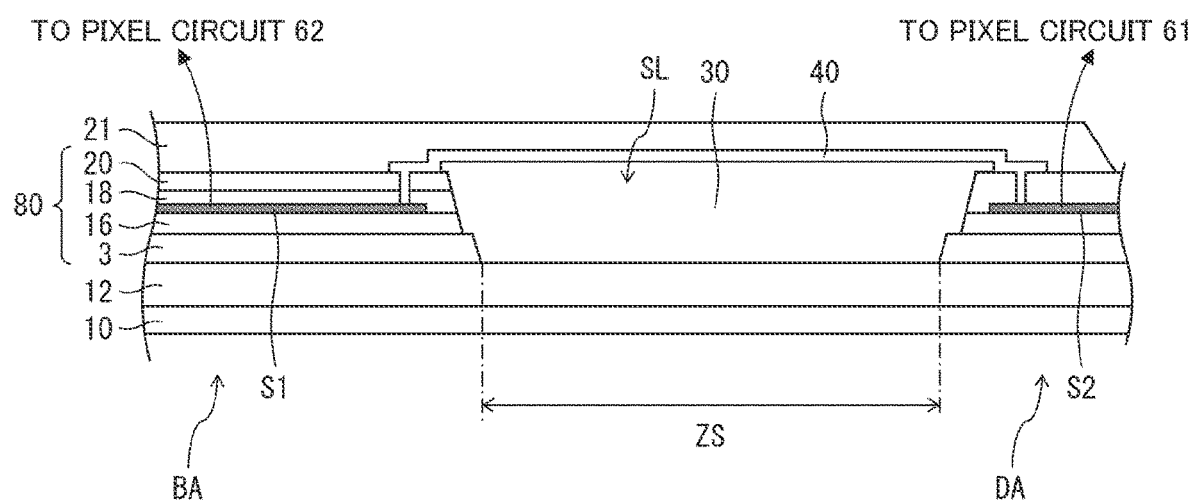
FIG. 2 is a cross-sectional view of a structure taken along A-A' shown in the drawing indicated by numeral 101.

A detailed description is given next of a structure around the bending portion ZS of the display device 1a with reference to FIG. 2. FIG. 2 is a cross-sectional view of a structure taken along A-A' shown in the drawing indicated by numeral 101. As shown in the figure, in the bending area BA and the display area DA, a PET film 10, a resin layer 12, an inorganic film (inorganic insulation film) 80, and an organic insulation film 21 are stacked in this order. The inorganic film (inorganic insulation film) 80 includes an inorganic insulation film (barrier film) 3, an inorganic insulation film 16, an inorganic insulation film 18, and an inorganic insulation film 20, all of which form a thin film transistor layer.

In addition, as shown in the figure, in the bending portion ZS, there is provided a slit St, in the inorganic film 80. This slit SL is filled by a filling layer (organic film) 30. The filling layer 30 is composed of a flexible material, for example, an organic material, such as polyimide or acrylic resin, that can be provided by printing or coating technology. Hence, the bending area BA can be bent from the display area DA by a maximum of approximately 180°.

In addition, in an upper layer of the filling layer 30, there are provided connection wiring lines 40 for electrically connecting signal lines S1 for the bending area. BA and signal lines S2 for the display area DA. In other words, in the present embodiment, the pixel circuit for the display area DA and the pixel circuit for the bending area BA are connected by the common connection wiring lines 40. Note that each of the signal lines S1 and S2 is either a data signal line or a scan signal line.

In addition, the signal lines S1 are connected to the pixel circuit 62 for the bending area BA, and the signal lines S2 are connected to the pixel circuit 61 for the display area DA. Additionally, the pixel circuits 61 and 62 include self-luminous light-emitting elements. Hence, reception of input video signals, monitoring control, and data acquisition can be performed similarly to a known-rectangular panel with no bending portion, and data signals can be easily handled.

Overview of Structure of Electronic Apparatus

Figure 3:
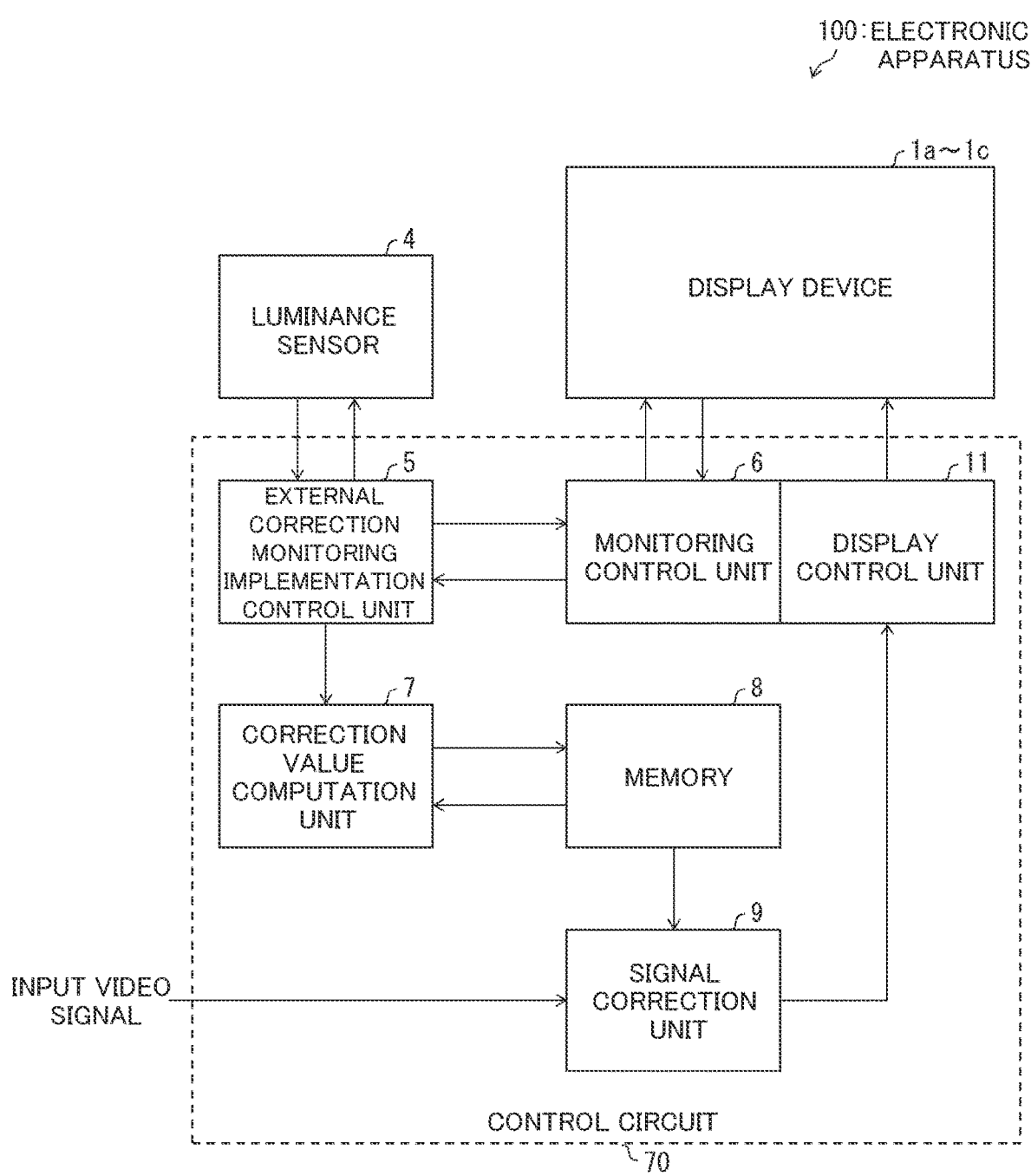
FIG. 3 is a schematic block diagram of a configuration of an electronic apparatus in accordance with Embodiment 1 of the disclosure.

A brief description is given next of a structure an electronic apparatus 100 in accordance with Embodiment 1 (or common to Embodiments 2 and 3 described later) of the disclosure with reference to FIG. 3. As shown in the figure, the electronic apparatus 100 includes the display devices 1a to 1c, the luminance sensor 4, and a control circuit 70. In addition, the control circuit 70 includes an external correction monitoring implementation control unit 5, a monitoring control unit 6, a correction value computation unit 7, a memory 8, a signal correction unit 9, and a display control unit 11.

In an ordinary video display, in response to an inputted video signal, the signal correction unit 9 corrects to a video signal that is compensated for decays, and a video is displayed on the display devices 1a to 1c via the display control unit 11.

The signal correction unit 9 retrieves a correction parameter for each pixel from the memory 8 and corrects an input video signal based on this. Additionally, when monitoring (either real time monitoring mode in a display or full screen monitoring mode by a user command is possible), the external correction monitoring implementation control unit 5 transmits a monitoring-starting instruction (including, for example, location and monitoring voltage) to the monitoring control unit 6 and acquires a monitoring value. Furthermore, a measurement instruction is transmitted also to the luminance sensor 4 to acquire luminance information. These pieces of information are transmitted to the correction value computation unit 7 to update the correction parameter.

The luminance sensor 4 included in the electronic apparatus 100 measures, during monitoring, the luminance of the bending area BA bent toward a part of the rear face of the display devices 1a to 1c for transmission to the external correction monitoring implementation control unit 5. The luminance may be continuously observed, not only during monitoring.

The correction value computation unit 7 acquires the monitoring current and voltage values for each pixel acquired from the monitoring control unit 6, the luminance information for the bending area BA acquired from the luminance sensor 4, and past measured values e.g., initial data) from the memory 8 and computes a new correction parameter for each pixel based on this set of data. The computed data is stored again in the memory 8 and utilized as a correction parameter in a subsequent ordinary display.

Decays of Luminous Efficiency and Electrical Decays of OLED Element

Figure 4:
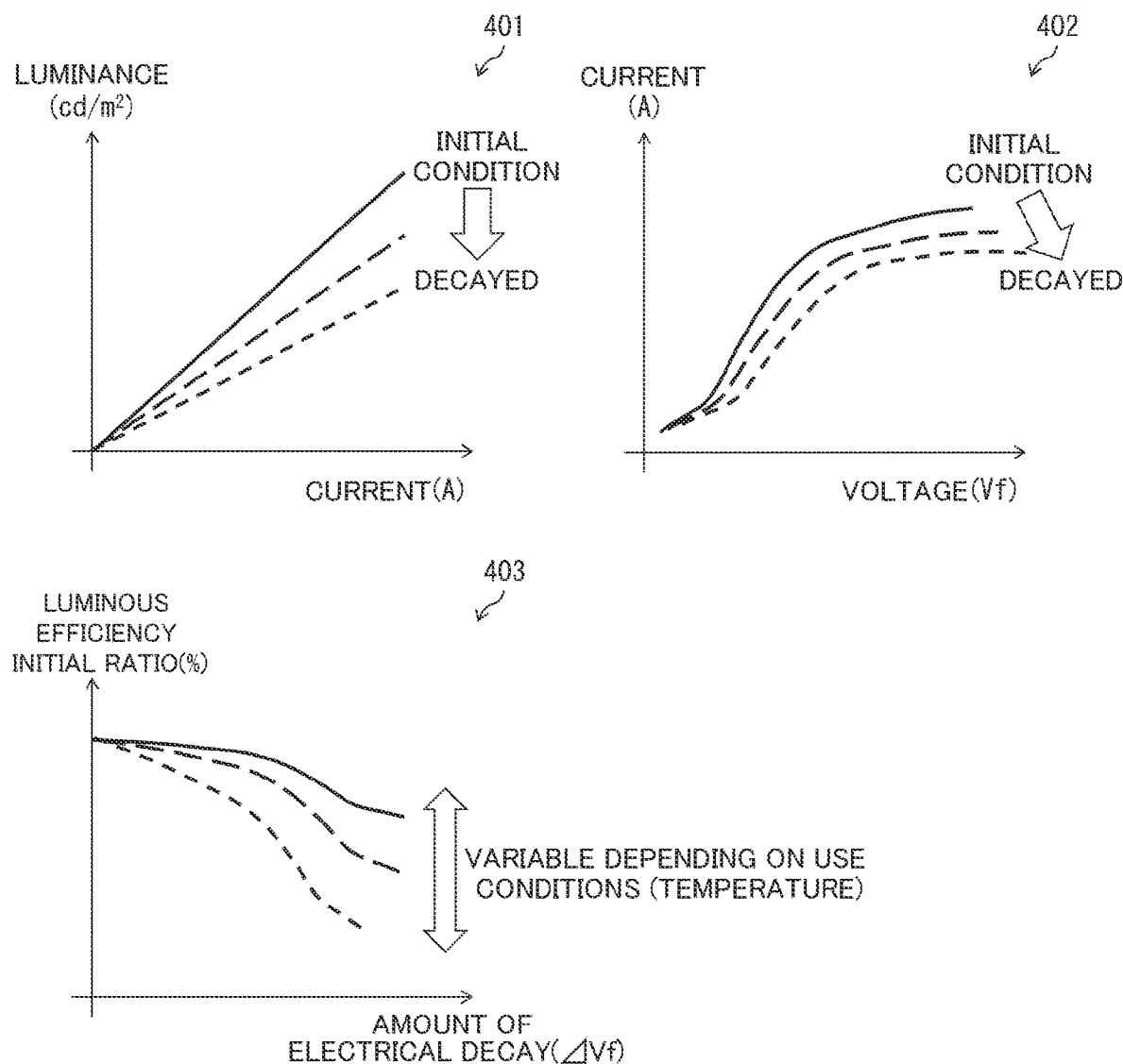
In FIG. 4, the drawing indicated by numeral 401 is a graph representing decays of the luminous efficiency of an OLED element, the drawing indicated by numeral 402 is a graph representing electrical decays of the OLED element, and the drawing indicated by numeral 403 is a graph representing a relationship between the electrical decays and the decays of the luminous efficiency of the OLED element.

A description is given next of decays of the luminous efficiency and the electrical decays of a common MED element with reference to FIG. 4. In FIG. 4, the drawing indicated by numeral 401 is a graph representing decays of the luminous efficiency of an OLED element. The graph shows that if the same current is fed to the OLED element as in the initial condition, the output luminance decreases. The decay proceeds at different rates, depending on, for example, how much current has been fed to each pixel in using the electronic apparatus 100 and under what temperature conditions the electronic apparatus 100 has been used. It is therefore difficult to predict an amount of decay.

Next, in FIG. 4, the drawing indicated by numeral 402 is a graph representing electrical decays of the ° LED element. Some correlation is found between the amount of electrical decay of the OLED element and the amount of decay of the luminous efficiency of the OLED element from the monitoring voltage and current values of the OLED element. Therefore, some methods have been proposed that predictively calculate an amount of correction for the luminous efficiency from an amount of electrical decay. However, accurate predictions are difficult because strictly, electrical decays and decreases in luminous efficiency proceed at different rates, depending on the temperature in using the electronic apparatus 100.

Next, in FIG. 4, the drawing indicated by numeral 403 is a graph representing a relationship between the electrical decays and the decays of the luminous efficiency of the OLED element. The graph indicates some relevance if the electronic apparatus 100 is continuously used under the same conditions. But it becomes difficult to know the current condition of the electronic apparatus 100 if use conditions (temperature) vary. However, if the luminance of a portion of the display panel that has been used under varying use conditions is measured, it is possible to associate the present amount of electrical decay and the present amount of decay of the luminous efficiency. On the basis of this mutually relevant data, the amount of decay (amount of correction) of the luminous efficiency can be calculated the amount of electrical decay recognized from the monitoring voltage and current of each pixel.

Flow of Monitoring Measurement and Correction Factor Computation

Figure 5:
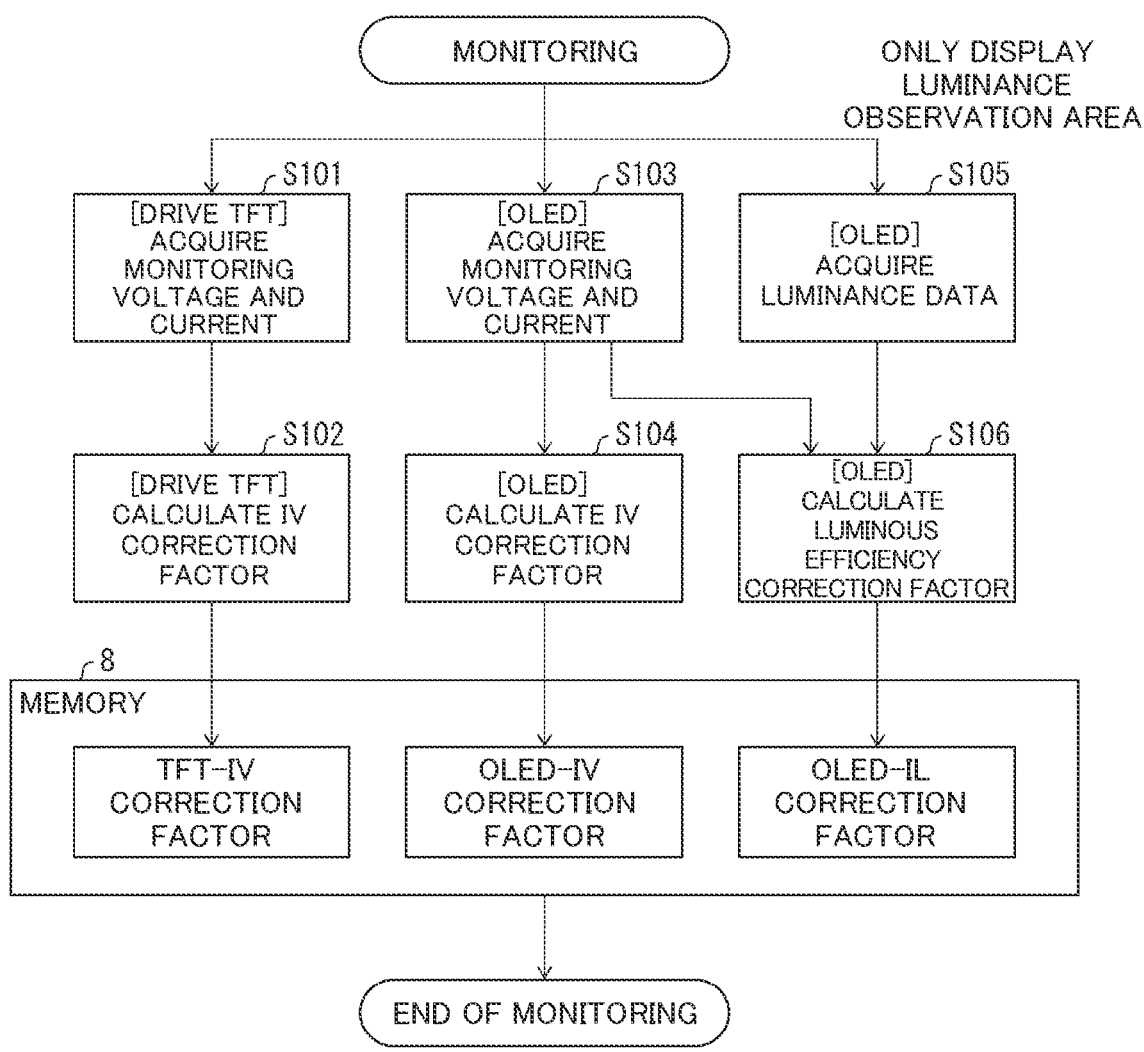
FIG. 5 is a flow chart representing a flow of monitoring measurement and correction factor computation.

A description is given next of a flow of monitoring measurement and correction factor computation with reference to the flow chart in FIG. 5. As shown in the figure, voltage and current are monitored for each pixel in the drive TEL' and OLED elements (S101, S103). An electrical correction factor for use in a video display is calculated and stored in the memory 8 (on the pixel-to-pixel basis; S102, S104).

Subsequently, luminance is measured upon performing voltage and current monitoring for the OLED element in the "bending area BA" (S105), and a correction factor for luminous efficiency correction for the current value of the MED element is calculated and stored in the memory 8 (a LUT of amounts of photoemission current correction for amounts of voltage correction of OLED element; S106).

Flow of Correction of Video Signal

Figure 6:
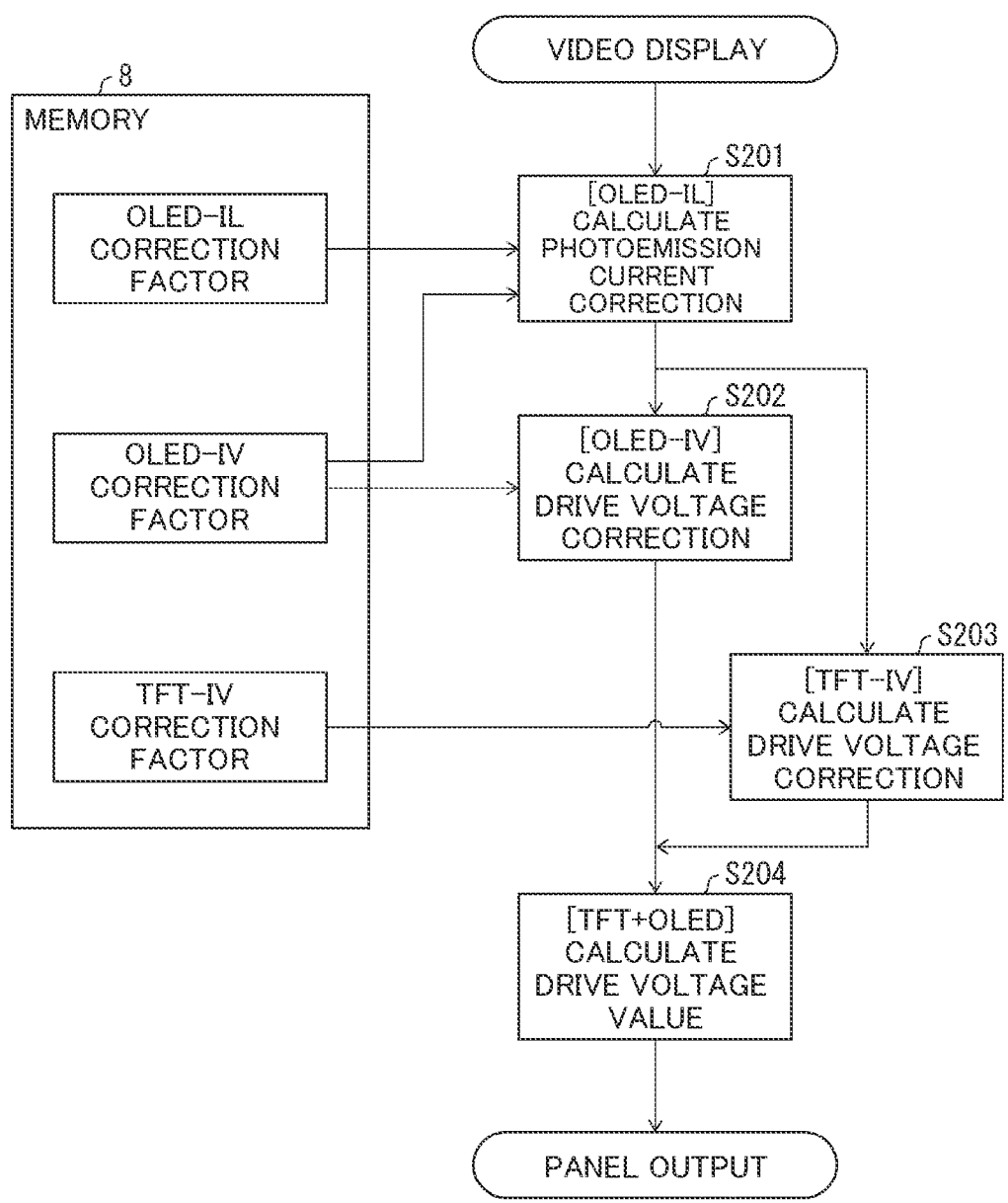
FIG. 6 is a flow chart representing a flow of video signal correction.

A description is given next of a flow of correction of a video signal with reference to the flow chart in FIG. 6. As shown in the figure, an amount of current (target current) that should be outputted after performing photoemission current correction on the OLED element is first calculated for an inputted video signal (S201). The amount of photoemission current correction is calculated based on an amount of voltage shift calculated from the OLED-IV correction factor in the memory 8 and based also on the OLED-IL correction factor (LUT).

Subsequently, for OLED-IV/TFT-IV drive voltage correction calculation, a drive voltage is calculated that produces the target current calculated above (S202, S203), and the sum of all the values is outputted as a data voltage to the panel (driver) (S204).

The "bending area BA" in the notched area NA is bent toward the rear side of the display panel, so that the luminance sensor 4 inside the housing 2 can measure luminance. Hence, by measuring the light-emission luminance of the decayed pixel on the pixel structure equivalent to the display area it is possible to accurately know the luminous efficiency of the pixel in the display area DA, In addition, by measuring the luminance on the rear side of the display panel, high precision measurement becomes possible without having to provide an extra space on the front face of the display panel, to have the capability of the luminance sensor 4 constrained, or to suffer from the effect of external light. Furthermore, the display drive control and monitoring control for the "bending area BA" can also be easily processed as part of a common video signal, which allows for streamlining.

Embodiment 2

Figure 7:
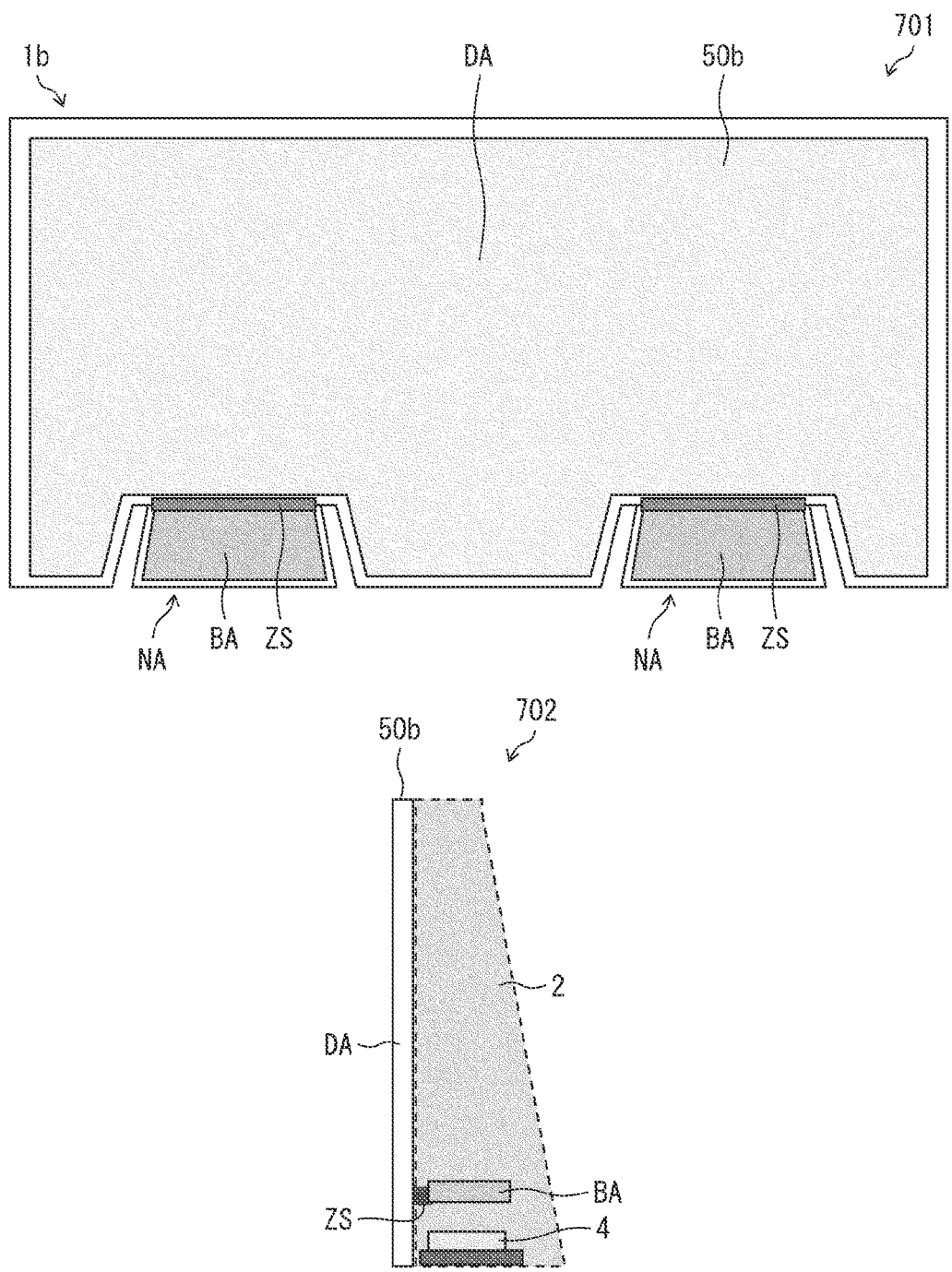
In FIG. 7, the drawing indicated by numeral 701 is a front view of a display device in accordance with Embodiment 2 of the disclosure, and the drawing indicated by numeral 702 is a cross-sectional view of the display device as viewed from the right-hand side face when the display device is viewed from the front.

A description is given next of another embodiment of the disclosure with reference to FIG. 7. Note that for convenience of description, members of the present embodiment that have the same function as members of the preceding embodiment are indicated by the same reference numerals, and description thereof is not repeated. FIG. 7 represents the disclosure applied to an onboard display panel (the display device 1b). Development of onboard display panels has been discussed, for example, for display devices of a non-regular shape (free form). Display devices have been proposed that have a shape that fits to the instruments around the display device and to the operation interface. In addition, onboard OLED elements need to operate under harsh use conditions such as high temperature in the vehicle and importantly, need to be modified against decays over time and for a high-precision correction method. As shown in the drawing indicated by numeral 701 in FIG. 7, the display device 1b includes a substrate 50b with a display area DA and a bending area BA. The substrate 50b is either entirely flexible or partially flexible in a portion corresponding to a bending line for the bending area BA.

As shown in the drawing indicated by numeral 701 in FIG. 7, the display device 1b in accordance with the present embodiment differs from the display device 1a in accordance with Embodiment 1 in that the former has a structure in which the display area. DA has two notched areas NA on the bottom thereof.

In addition, similarly to the display device 1a in accordance with Embodiment 1, each notched area NA has the "bending area BA" in a bendable condition, so that the "bending area BA" can be folded toward the rear side of the display panel for use in luminance decay observation. Furthermore, there is provided a luminance sensor 4 inside the housing 2 on the rear face of the display panel such that the output luminance of the "bending area BA" can be measured. Additionally in the present embodiment, as shown in the drawing indicated by numeral 702 in FIG. 7, the bending area. BA differs from the display device 1a in accordance with Embodiment 1 in being bent from the display area DA by approximately 90°. The bending area BA may be used in a horizontally bend condition in this manner. The bending portion ZS has a periphery with the same structure as in Embodiment 1 (see FIG. 2). As in the present embodiment, there may be provided a plurality of "bending areas BA" in the display panel, and these "bending areas BA" are not necessarily limited to a rectangular shape. The present embodiment uses the same correction method that uses the monitoring voltage and current and the luminance data as Embodiment 1.

In the present embodiment, the screen may be divided into a left and a right portion by using the two "bending areas BA," and if the results of measurement differ for the left and the right portion, the correction factor may be changed for the left and the right portion of the display area DA. In addition, as an effect of the provision of the bending area BA in a plurality of locations, if decay proceeds at a different rate in different area, the display area DA may be divided into a plurality of block areas so that a different luminous efficiency correction factor can be used for different area.

Embodiment 3

Figure 8:
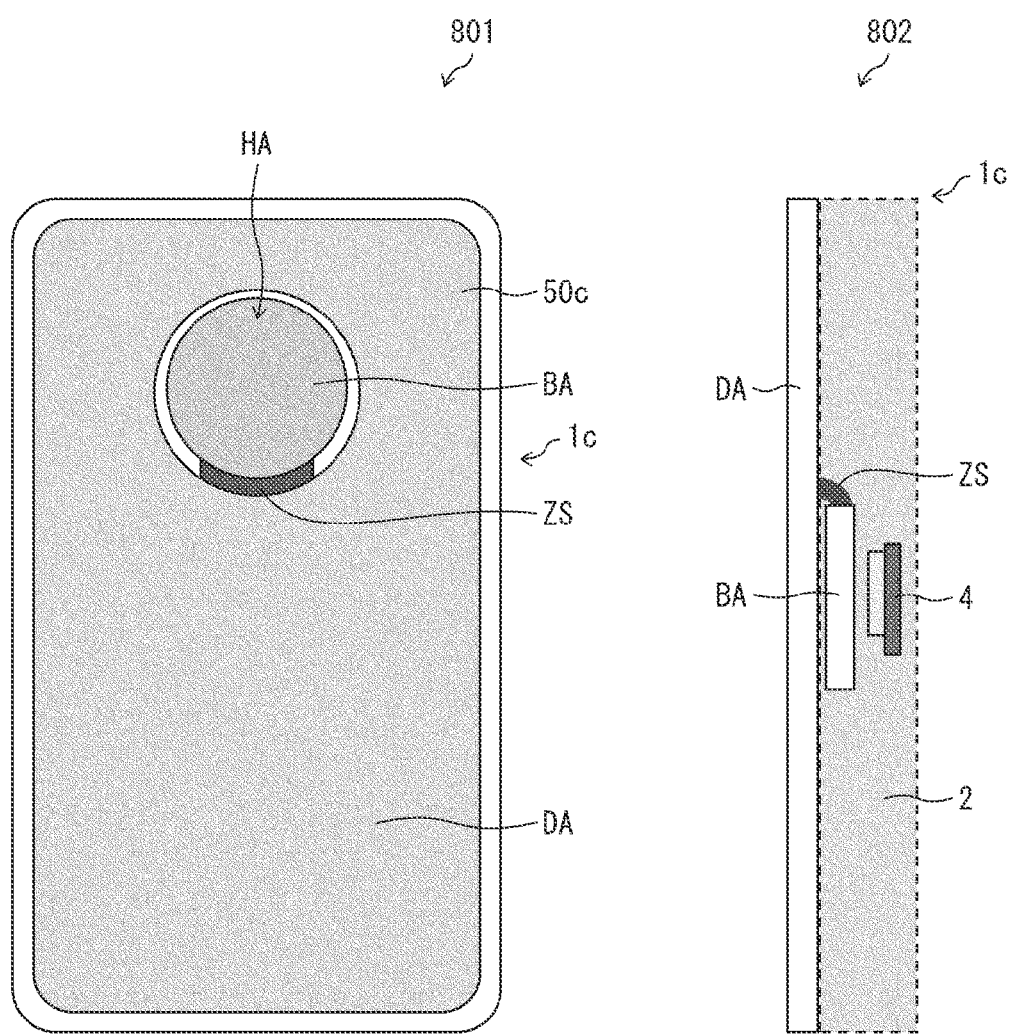
In FIG. 8, the drawing indicated by numeral 801 is a front view of a display device in accordance with Embodiment 3 of the disclosure, and the drawing indicated by numeral 802 is a cross-sectional view of the display device as viewed from the right-hand side face when the display device is viewed from the front.

A description is given next of another embodiment of the disclosure with reference to FIG. 8. Note that for convenience of description, members of the present embodiment that have the same function as members of any of the preceding embodiments are indicated by the same reference numerals, and description thereof is not repeated.

The display device 1c in accordance with the present embodiment, unlike Embodiments 1 and 2 where the notched area(s) NA reside on an edge of the screen, has a hollowed-out region HA formed in the center of the screen as shown in the drawing indicated by numeral 801 in FIG. 8. The central area of the screen can be individually driven, and the area can be made circular, by using technology of dispersedly positioning gate drivers for a display device of a non-regular shape (free form) in the screen.

As shown in the drawing indicated by numeral 801 in FIG. 8, the display device 1c includes a substrate 50c with a display area DA and a bending area BA. The substrate 50c is either entirely flexible or partially flexible in a portion corresponding to a bending line for the bending area BA.

In the present embodiment, the display area DA has the hollowed-out region HA therein, and the bending line is a part of the periphery of the hollowed-out region HA. In other words, the "bending area BA" is provided in the hollowed-out region HA located in the central area of the screen and is folded toward the rear face for use in luminance decay observation.

As shown in the drawing indicated by numeral 802, there is provided a luminance sensor 4 inside the housing 2 on the rear face of the display panel such that the output luminance of the "bending area BA" can be measured. For the bending portion ZS, either the panel may be entirely flexible or the wiring portion to the "bending area BA" may only be flexible. The present embodiment uses the same correction method that uses the monitoring voltage and current and the luminance data as Embodiment 1.

In the present embodiment, by measuring the light-emission luminance of the decayed pixel on the pixel structure equivalent to the display area DA, it is possible to accurately know the luminous efficiency of the pixel in the display area DA. In addition, by measuring the luminance on the rear face, high precision measurement becomes possible without having to provide an extra space on the front face of the display panel, to have the capability of the luminance sensor constrained, or to suffer from the effect of external light. Furthermore, the display drive control and monitoring control for the "bending area BA" can also be easily processed as part of a common video signal, which allows for streamlining.

Additionally, in the display device 1c in accordance with the present embodiment, by providing the circular hollowed-out region HA in the central area of the screen, an onboard display panel will allow a structure in which a physical (analog) meter is provided in combination in the circular area. In addition, in the display device 1c in accordance with the present embodiment, by providing the hollowed-out region HA, a structure becomes possible in which an adjustment interface such as a circular rotating knob can be provided in combination.

General Description

The electro-optical element included in the display devices 1a to 1c in each of the foregoing embodiments (the electro-optical element the luminance and transmittance of which are controlled through current) is not limited in any particular manner. These display devices 1a to 1c may be, for example, an organic EL (electroluminescence) display device including OLEDs (organic light-emitting diodes) as electro-optical elements, an inorganic EL display device including inorganic light-emitting diodes as electro-optical elements, or a QLED display device including QLEDs (quantum dot light-emitting diodes) as electro-optical elements.

Aspect 1

A display device of aspect 1 of the disclosure includes: a substrate with a display area and a bending area; and a luminance sensor, wherein the display area and the bending area each include a pixel circuit including a light-emitting element that is self-luminous, the bending area is bent from the display area, and the luminance sensor measures luminance of the light-emitting element in the bending area.

Aspect 2

The display device wherein the luminance sensor faces the bending area.

Aspect 3

The display device of aspect 1 or 2, further including a bending portion between the display area and the bending area, wherein in the bending portion, an inorganic insulation film included in a thin film transistor layer has a slit, a filling layer is provided filling the slit, and a connection wiring line electrically connecting a signal line for the display area and a signal line for the bending area is provided in an upper layer of the filling layer.

Aspect 4

The display device of aspect 3, wherein the pixel circuit of the display area and the pixel circuit of the bending area are connected to the connection wiring line which is common.

Aspect 5

The display device of any one of aspects 1 to 4, further including a control circuit configured to control the light-emitting element in the display area based on a result of measurement by the luminance sensor.

Aspect 6

The display device of any one of aspects 1 to 5, wherein the bending area is bent along a part of a periphery of the display area as a bending line.

Aspect 7

The display device of aspect 6, wherein a notched area is formed in the display area, and the bending line is a part of a periphery of the notched area.

Aspect 8

The display device of aspect 6, wherein a hollowed-out region is formed in the display area, and the bending line is a part of a periphery of the hollowed-out region.

Aspect 9

The display device of aspect 3 or 4, wherein the connection wiring line is either a data signal line or a scan signal line.

Aspect 10

The display device of any one of aspects 1 to 9, wherein the bending area is bent from the display area by 180°.

Aspect 11

The display device of any one of aspects 1 to 9, wherein the bending area is bent from the display area by 90°.

Aspect 12

The display device of any one of aspects 1 to 11, wherein the substrate is entirely, flexible.

Aspect 13

The display device of aspect 6, wherein the substrate is partially flexible in a portion corresponding to the bending line.

ADDITIONAL REMARKS

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A display device comprising:
   a substrate with a display area and a bending area; and
   a luminance sensor, wherein
   the display area and the bending area each include a pixel circuit including a light-emitting element that is self-luminous,
   the bending area is bent from the display area, and
   the luminance sensor measures luminance of the light-emitting element in the bending area.

2. The display device according to claim 1, wherein the luminance sensor faces the bending area.

3. The display device according to claim 1, further comprising a bending portion between the display area and the bending area, wherein
   in the bending portion, an inorganic insulation film included in a thin film transistor layer has a slit,
   a filling layer is provided filling the slit, and
   a connection wiring line electrically connecting a signal line for the display area and a signal line for the bending area is provided in an upper layer of the filling layer.

4. The display device according to claim 3, wherein the pixel circuit of the display area and the pixel circuit of the bending area are connected to the connection wiring line which is common.

5. The display device according to claim 1, further comprising a control circuit configured to control the light-emitting element in the display area based on a result of measurement by the luminance sensor.

6. The display device according to claim 1, wherein the bending area is bent along a part of a periphery of the display area as a bending line.

7. The display device according to claim 6, wherein
   a notched area is formed in the display area, and
   the bending line is a part of a periphery of the notched area.

8. The display device according to claim 6, wherein
   a hollowed-out region is formed in the display area, and
   the bending line is a part of a periphery of the hollowed-out region.

9. The display device according to claim 3, wherein the connection wiring line is either a data signal line or a scan signal line.

10. The display device according to claim 1, wherein the bending area is bent from the display area by 180°.

11. The display device according to claim 1, wherein the bending area is bent from the display area by 90°.

12. The display device according to claim 1, wherein the substrate is entirely flexible.

13. The display device according to claim 6, wherein the substrate is partially flexible in a portion corresponding to the bending line.

* * * * *